(12) United States Patent
Wang et al.

(10) Patent No.: US 12,150,270 B2
(45) Date of Patent: Nov. 19, 2024

(54) TRAY ASSEMBLY AND ELECTRONIC DEVICE

(71) Applicant: WISTRON CORP., New Taipei (TW)

(72) Inventors: Jun-Hao Wang, New Taipei (TW); Hua-Jun Liang, New Taipei (TW)

(73) Assignee: WISTRON CORP., New Taipei (TW)

( * ) Notice: Subject to any disclaimer, the term of this patent is extended or adjusted under 35 U.S.C. 154(b) by 80 days.

(21) Appl. No.: 17/931,153

(22) Filed: Sep. 12, 2022

(65) Prior Publication Data

US 2023/0337387 A1 Oct. 19, 2023

(30) Foreign Application Priority Data

Apr. 14, 2022 (CN) .................. 202210389868.X

(51) Int. Cl.
*H05K 5/02* (2006.01)
*H05K 7/14* (2006.01)
*G06F 1/18* (2006.01)

(52) U.S. Cl.
CPC ......... *H05K 7/1487* (2013.01); *H05K 5/0221* (2013.01); *H05K 5/023* (2013.01); *H05K 7/1489* (2013.01); *G06F 1/183* (2013.01)

(58) Field of Classification Search
CPC .... H05K 7/1487; H05K 7/1489; H05K 5/023; H05K 5/0221; G06F 1/183
See application file for complete search history.

(56) References Cited

U.S. PATENT DOCUMENTS

| | | | |
|---|---|---|---|
| 9,122,458 B2 | 9/2015 | Yu | |
| 9,462,719 B2* | 10/2016 | Wu | ........... H05K 7/1487 |
| 9,826,658 B1* | 11/2017 | Mao | ............ G06F 1/183 |
| 10,251,300 B1* | 4/2019 | Mao | ........... H05K 7/1487 |
| 10,285,300 B1 | 5/2019 | Mao | |
| 10,470,334 B1* | 11/2019 | Mao | ........... H05K 7/1489 |
| 10,863,644 B1 | 12/2020 | Tseng et al. | |
| 10,888,025 B2* | 1/2021 | Wu | ........... H05K 7/1487 |
| 11,683,904 B2* | 6/2023 | Chang | ........... H05K 7/1489 |
| | | | 361/679.02 |

(Continued)

FOREIGN PATENT DOCUMENTS

| CN | 108508980 A | 9/2018 |
|---|---|---|
| CN | 110392504 A | 10/2019 |

(Continued)

OTHER PUBLICATIONS

TW Office Action dated May 10, 2023 in Taiwan application No. 111118795.

*Primary Examiner* — Kimberley S Wright
(74) *Attorney, Agent, or Firm* — McClure, Qualey & Rodack, LLP

(57) ABSTRACT

A tray assembly includes a tray body, a tray handle, and a first slide plate, where the tray body includes a first side plate and a second side plate located opposite to each other, the first side plate includes a first plate portion and a second plate portion, a distance between the second plate portion and the second side plate is shorter than a distance between the first plate portion and the second side plate, the tray handle is pivotally connected to the first side plate and the second side plate, and the first slide plate is slidably disposed on the first side plate and movable with the tray handle.

20 Claims, 14 Drawing Sheets

(56) References Cited

U.S. PATENT DOCUMENTS

| | | | |
|---|---|---|---|
| 2015/0070858 A1* | 3/2015 | Wu ...................... | H05K 7/1417 |
| | | | 361/807 |
| 2017/0150621 A1* | 5/2017 | Breakstone ........ | H05K 7/20736 |
| 2020/0146185 A1* | 5/2020 | Wu ...................... | H05K 7/20172 |
| 2020/0396859 A1 | 12/2020 | Liu et al. | |
| 2021/0385962 A1* | 12/2021 | Chang ................... | H05K 5/023 |
| 2022/0312623 A1* | 9/2022 | Chang .................. | H05K 7/1489 |

FOREIGN PATENT DOCUMENTS

| | | |
|---|---|---|
| TW | 201512816 A | 4/2015 |
| TW | I666542 B | 7/2019 |
| TW | I693877 B | 5/2020 |
| TW | M604477 U | 11/2020 |

* cited by examiner

TRAY ASSEMBLY AND ELECTRONIC DEVICE

CROSS-REFERENCE TO RELATED APPLICATIONS

This non-provisional application claims priority under 35 U.S.C. § 119(a) on Patent Application No(s). 202210389868.X filed in China on Apr. 14, 2022, the entire contents of which are hereby incorporated by reference.

TECHNICAL FIELD

The disclosure relates to a tray, more particularly relates to an electronic device including a tray assembly.

BACKGROUND

A housing of a computer host or a sever host may contain detachable casing or tray to improve the utilization of the internal space. Taking the tray in the server housing as an example, the tray can be served to carry circuit board and specific elements, such as expansion card, hard disk, power distribution module or power supply module, such that the user is allowed to install them all into the server housing by simply placing the tray.

To facilitate moving the tray, there are handles arranged on the tray, and a typical tray has a latching mechanism movable by the handle, such that the user is allowed to move the tray by holding the handle and to engaging the latching mechanism with the server housing by operating the handle. The handle and the related latching mechanism will increase the overall width of the tray in the lateral direction, thus, conventionally, the tray that has handle and latching mechanism thereon are only permitted to be arranged in the specific wider internal area of the server housing. For example, in some cases that the server housing has recesses on its sidewalls, the part of the internal space that is located between the recesses is narrower than other parts of the internal space and therefore is not enough to accommodate the tray. As a result, the tray that has handle and latching mechanism has to avoid such limiting area and thereby resulting in unwanted limitations to the space utilization.

SUMMARY

Accordingly, one aspect of the disclosure is to provide a tray assembly and an electronic device including the same where the tray assembly is suitable for being accommodated in an internal space of a casing with width variation.

One embodiment of the disclosure provides a tray assembly including a tray body, a tray handle, and a first slide plate, where the tray body includes a first side plate and a second side plate located opposite to each other, the first side plate includes a first plate portion and a second plate portion, a distance between the second plate portion and the second side plate is shorter than a distance between the first plate portion and the second side plate, the tray handle is pivotally connected to the first side plate and the second side plate, the first slide plate is slidably disposed on the first side plate and movable with the tray handle.

One embodiment of the disclosure provides an electronic device including a housing, a housing handle, and a tray assembly, where the housing includes a sidewall and a positioning post, the sidewall includes a recess portion, the housing handle is disposed at the recess portion, the tray assembly is detachably accommodated in the housing and includes a tray body, a tray handle, and a first slide plate, the tray body includes a first side plate and a second side plate located opposite to each other, the first side plate includes a first plate portion and a second plate portion, a distance between the second plate portion and the second side plate is shorter than a distance between the first plate portion and the second side plate, the second plate portion corresponds to the recess portion, the tray handle is pivotally connected to the first side plate and the second side plate, the first slide plate is slidably disposed on the first side plate, when the first slide plate is forced by the tray handle, the first slide plate is releasably engaged with the positioning post of the housing.

One embodiment of the disclosure provides a tray assembly adapted to be connected to a housing and including a tray body, a tray handle, and a slide plate, where the tray body includes a side plate, the tray handle is pivotally connected to the side plate, and the slide plate is slidably passing through the side plate, and the slide plate is movable with the tray handle.

According to the tray assembly and the electronic device as discussed in the above embodiments of the disclosure, different portions of one side plate of the tray body are spaced apart from another side plate by different distances, or the slide plate that is movable with the tray handle is slidably disposed at the side plate, which makes the tray assembly of the disclosure capable of being accommodated within an internal space of a server housing with width variation and thereby facilitating to optimize the internal space utilization of the server housing.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

Figure 1:
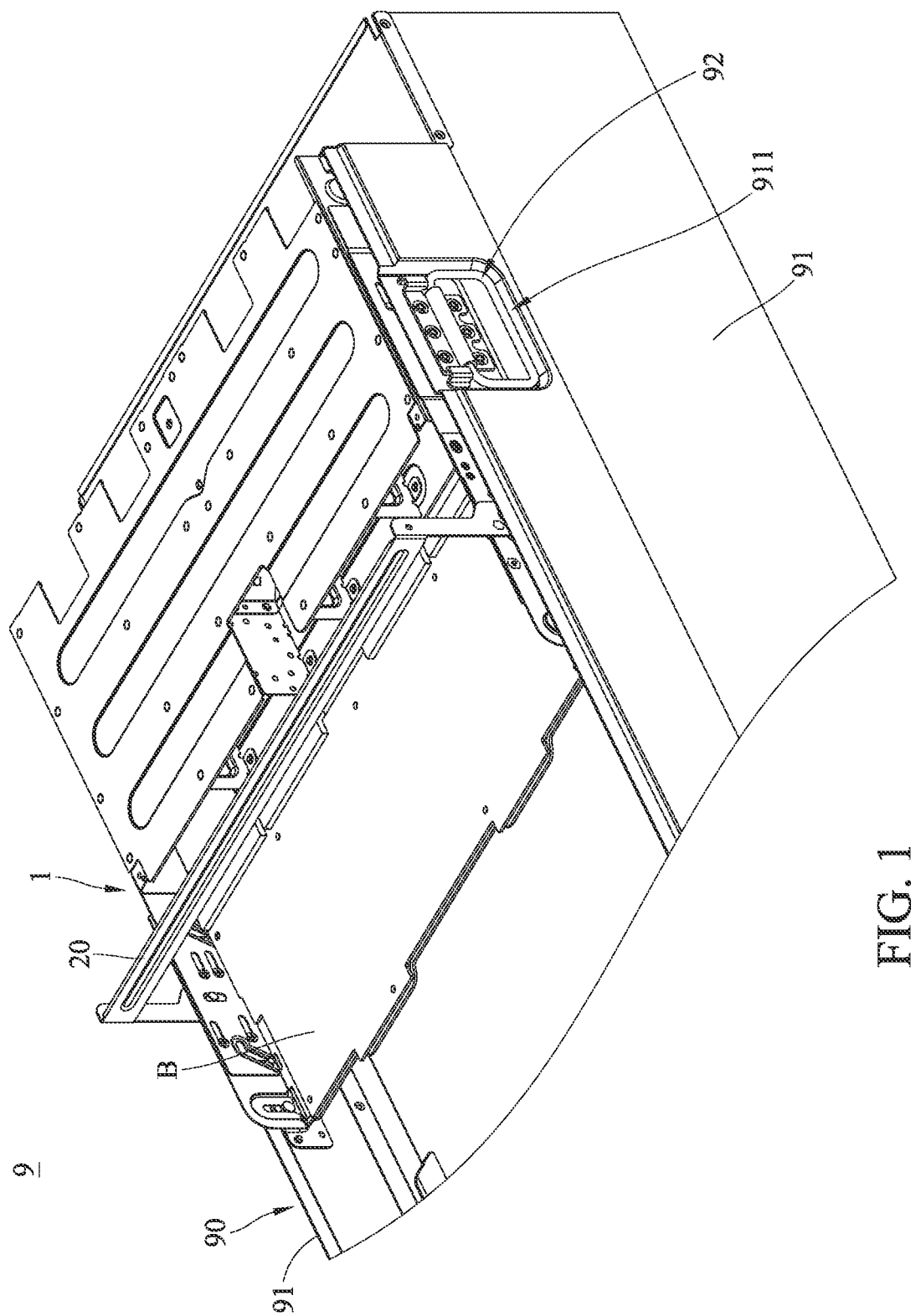
FIG. 1 is a partially enlarged perspective view of an electronic device according to one embodiment of the disclosure.
Figure 2:
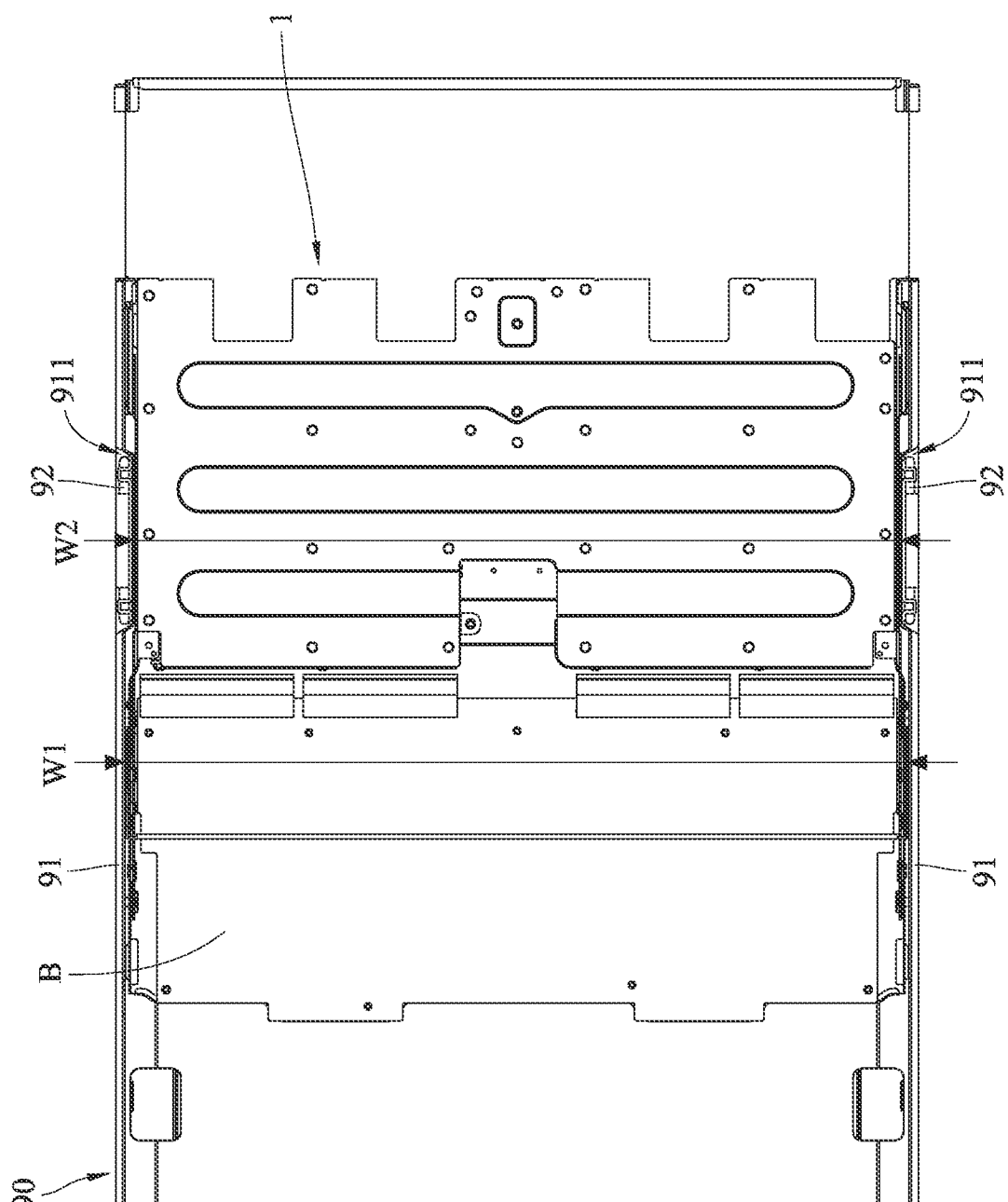
FIG. 2 is a partially enlarged top view of the electronic device according to one embodiment of the disclosure.
Figure 3:
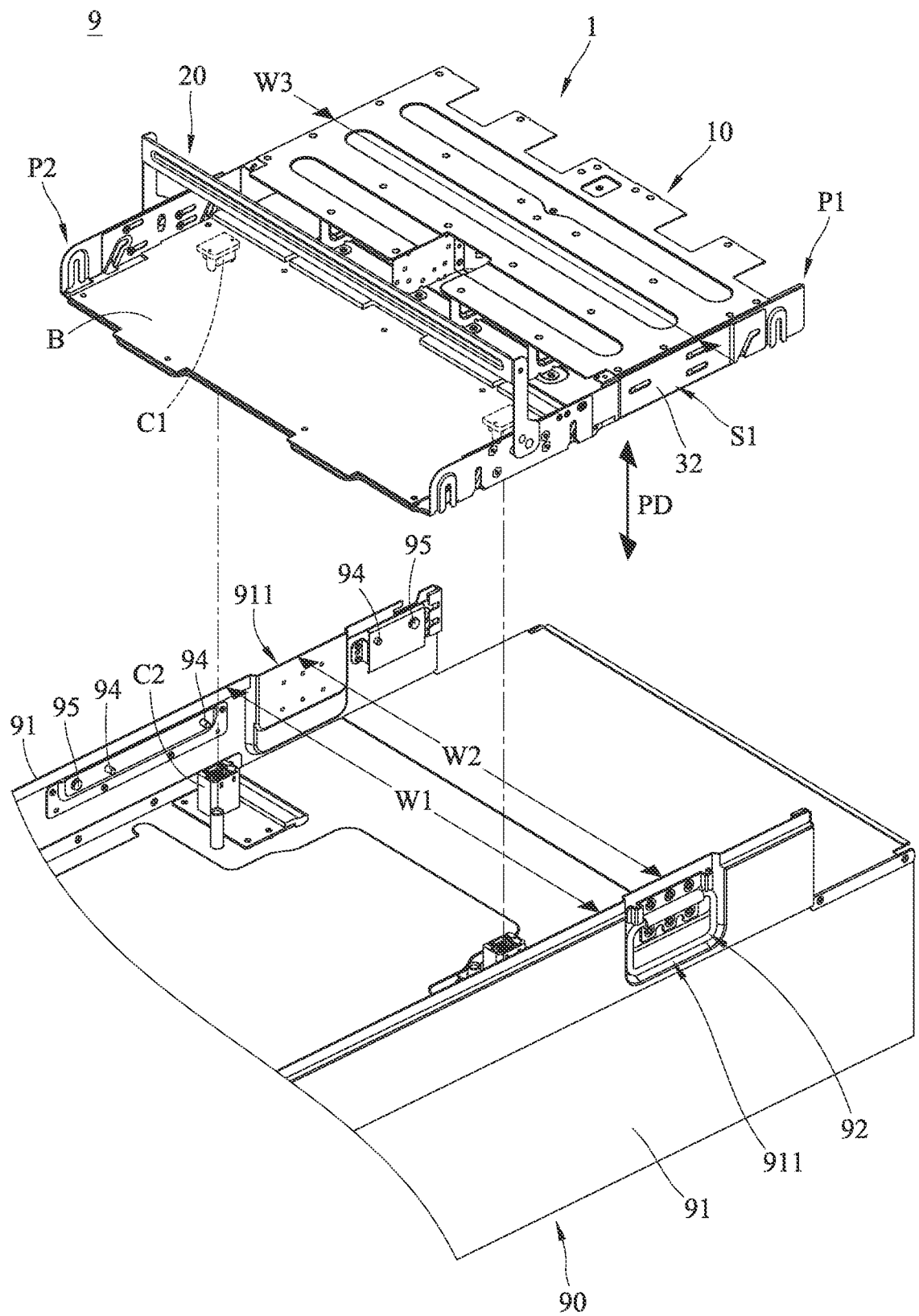
FIG. 3 is an exploded view of the electronic device according to one embodiment of the disclosure.

Firstly, referring to FIGS. 1-3, one embodiment of the disclosure provides an electronic device 9, where FIG. 1 is a partially enlarged perspective view of the electronic device 9, FIG. 2 is a partially enlarged top view of the electronic device 9, and FIG. 3 is an exploded view of the electronic device 9. The electronic device 9 may be, but is not limited to, a desktop, a computer, a server, part of any one thereof, or a detachable module or part thereof which can be accommodated in a server. In this embodiment, the electronic device 9 may include a housing 90, the housing 90 may include two sidewalls 91 respectively located at two opposite sides of the electronic device 9. The sidewalls 91 may define a space therebetween for accommodating at least one tray assembly 1. The space defined by the sidewalls 91 may also accommodate other electrical and non-electrical components or assemblies (not shown) as required.

In this embodiment, the electronic device 9 may further include at least one housing handle 92. For example, there may be two housing handles 92 respectively arranged at the outer surfaces of the sidewalls 91 of the housing 90. The housing handles 92 can be positioned parallel to the sidewalls 91 when not in use. The housing handles 92 can be pivoted outward to become handheld able by user so that the user can carry the housing 90 by holding the housing handles 92. In more detail, each sidewall 91 may include at least one recess portion 911 for accommodating the housing handle 92 when the housing handle 92 is not in use. When the housing handle 92 is laid flat in the recess portion 911, the housing handle 92 does not protrude out the outermost surface of the sidewall 91. The recess portion 911 herein means a structure recessed inward from the outer surface of the sidewall 91 with a depth that may be greater than a thickness of the housing handle 92.

Due to the existence of the recess portion 911, different portions of the housing 90 have different widths. For example, as shown in FIG. 2, the portion of the housing 90 that does not have the recess portions 911 may have a width W1, the other portion of the housing 90 that have the recess portions 911 may have a width W2, and the width W1 is greater than the width W2. In other words, the internal area of the housing 90 at the recess portions 911 may be narrower than the internal area of the housing 90 other than the recess portions 911.

The tray assembly 1 may be removably accommodated in the housing 90 and arranged between the sidewalls 91. The tray assembly 1 is configured to support or accommodate at least one electrical component (not shown or not numbered, for example, circuit board, connector, expansion card, hard disk, power distribution module, and/or power supply module) and/or non-electrical component (not shown or not numbered, for example, partition plate or top cover). Thus, the required components can be installed into the electronic device 9 along with the installation of the tray assembly 1 into the housing 90. Note that the components that the tray assembly 1 can support are not intended to limit the disclosure.

As shown, part of the tray assembly 1 can be arranged at the internal space of the housing 90 located at the recess portions 911; in other words, part of the tray assembly 1 can be arranged at a wider internal space of the housing 90 that is not located between the recess portions 911, while the other part of the tray assembly 1 can be arranged at a narrower internal space of the housing 90 that is located between the recess portions 911.

Figure 4:
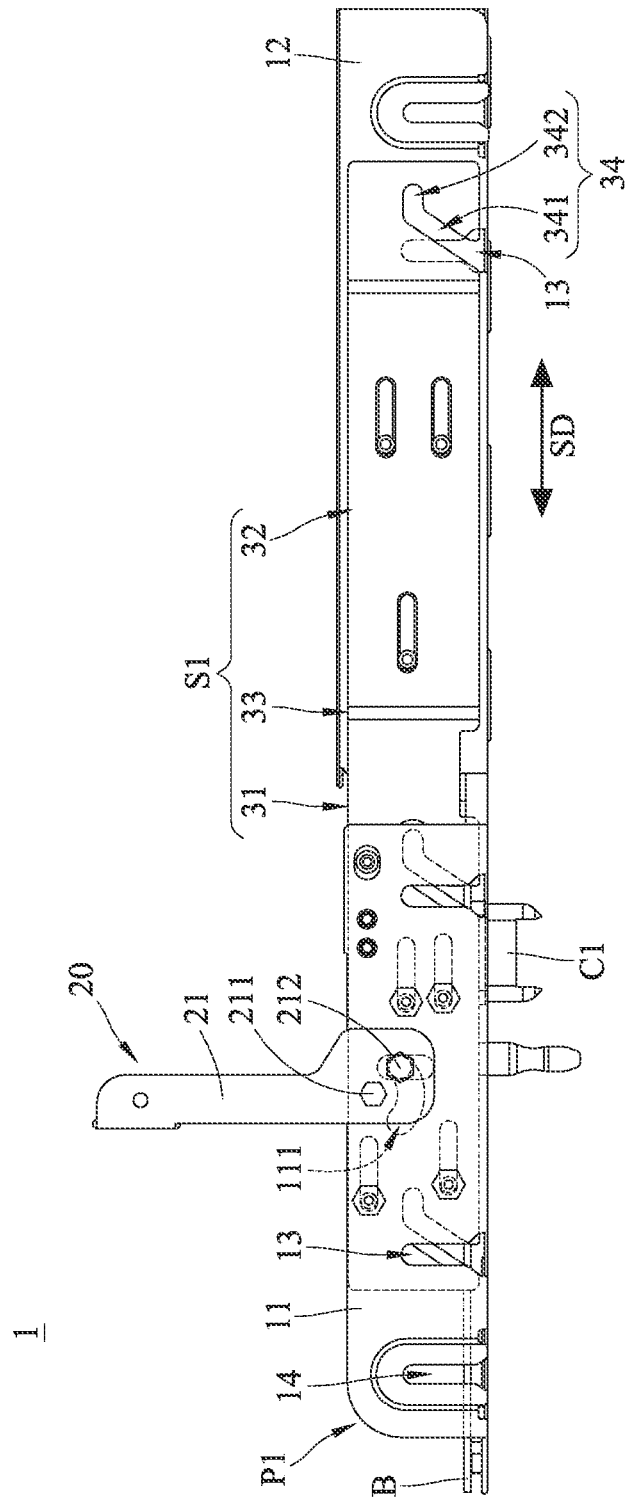
FIG. 4 is a side view of a tray assembly according to one embodiment of the disclosure.
Figure 5:
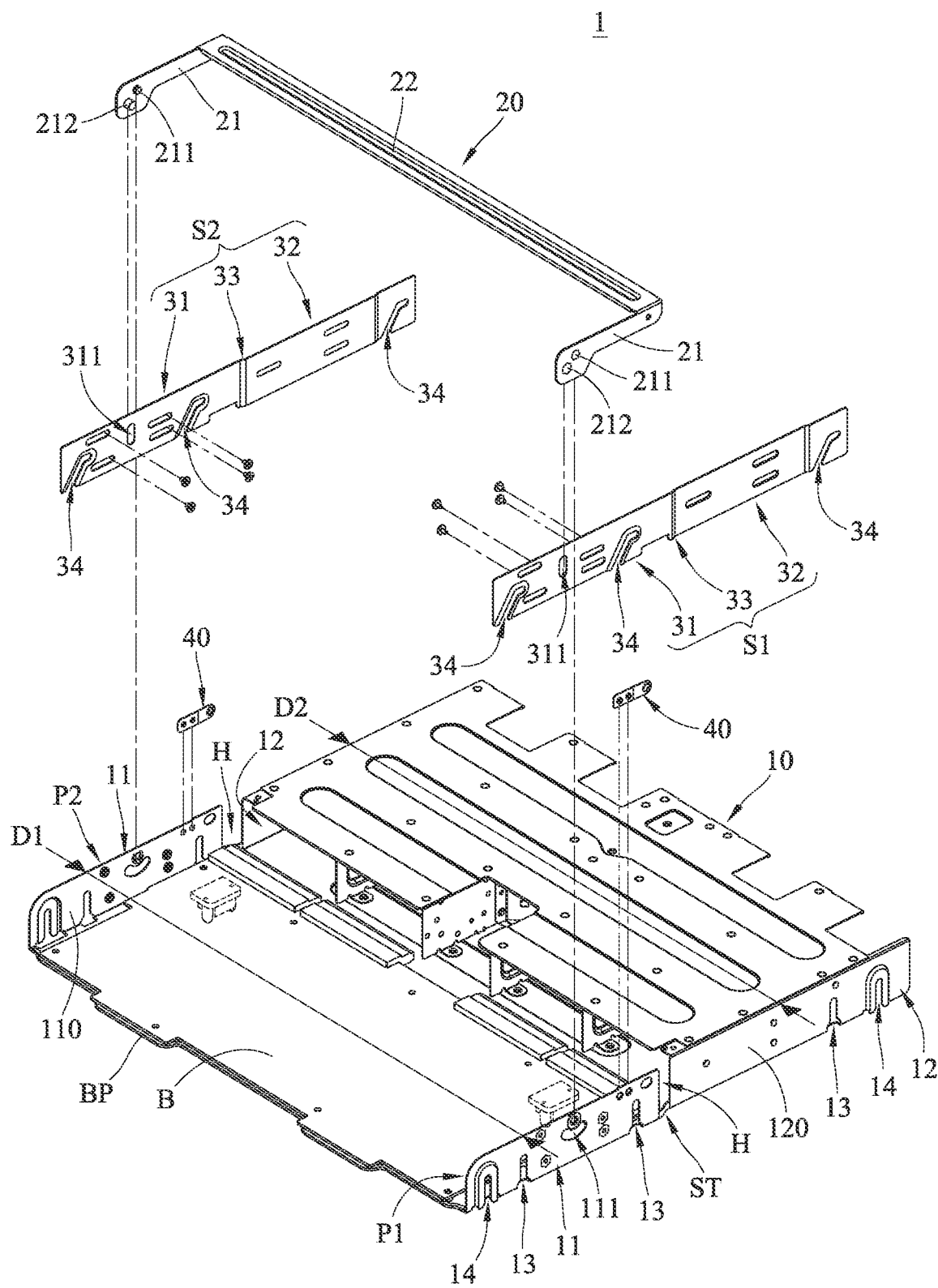
FIG. 5 is an exploded view of the tray assembly according to one embodiment of the disclosure.

Please also refer to FIGS. 4-5, where FIG. 4 is a side view of the tray assembly 1 and FIG. 5 is an exploded view of the tray assembly 1, in this embodiment, the tray assembly 1 may include a tray body 10, a tray handle 20, and at least one slide plate (e.g., a first slide plate S1 and a second slide plate S2). The tray body 10 means the part of the tray assembly 1 configured to support the tray handle 20, first slide plate S1, the second slide plate S2, and other optional components (not shown). The tray handle 20 is pivotably disposed on the tray body 10 and is handheld able by user. The first slide plate S1 and the second slide plate S2 are respectively movably disposed on two opposite sides of the tray body 10. The first slide plate S1 and the second slide plate S2 are movable by the tray handle 20. The first slide plate S1 and the second slide plate S2 are releasably engaged with the housing 90 so as to fix the tray assembly 1 to the housing 90.

In detail, in this embodiment, the tray body 10 may include at least one side plate (e.g., a first side plate P1 and a second side plate P2). The first side plate P1 and the second side plate P2 are respectively located at two opposite sides of the tray body 10. The first side plate P1 and the second side plate P2 may be respectively standing at two opposite sides of a bottom plate BP of the tray body 10. The bottom plate BP may support a circuit board B. Optionally, the tray body 10 may include at least one connector C1 thereon, the connector C1 is electrically connected to the circuit board B, as shown, the connector C1 may be arranged at a side of the bottom plate BP opposite to the circuit board B and is configured to electrically connect a connector C2 (as shown in FIG. 3) on the housing 90 when the tray assembly 1 is installed on the housing 90. As such, the components supported by the tray assembly 1 are able to be electrically connected to the components on the housing 90 through the electrical connection of the connector C1 and the connector C2. For example, the circuit board B on the tray body 10 of the tray assembly 1 may be electrically connected to at least one power distribution module and at least one power supply module; thus, the power distribution module and the power supply module are able to be electrically connected to other components on the housing 90 when the tray assembly 1 is installed into the housing 90 to connect the connector C1 to the connector C2.

Note that the configurations of the first side plate P1 and the second side plate P2 are symmetrical, thus, for the purpose of simplicity, only one of them will be introduced in detail hereinafter.

Figure 6:
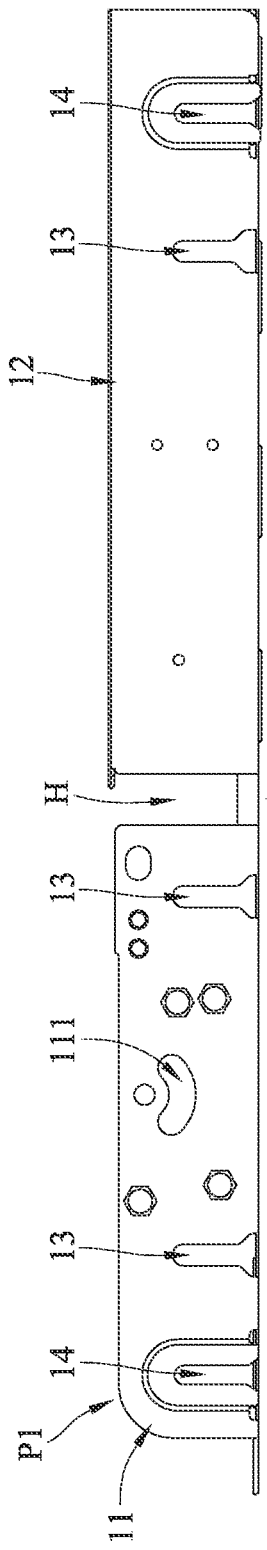
FIG. 6 is a side view of a first side plate of the tray assembly according to one embodiment of the disclosure.

Please refer to FIG. 5 and further refer to FIG. 6, where FIG. 6 is a side view of the first side plate P1, taking the first side plate P1 as an example, in this embodiment, the first side plate P1 may include a first plate portion 11 and a second plate portion 12, the first plate portion 11 and the second plate portion 12 may be two plate structures substantially parallel to each other while the first plate portion 11 and the second plate portion 12 are not coplanar. In this arrangement, different parts of the tray body 10 have different widths.

As shown, the first plate portion 11 of the first side plate P1 may be spaced apart from the second side plate P2 by a distance of D1; more specifically, the tray body 10 has a width of D1 between the first plate portion 11 of the first side plate P1 and the first plate portion 11 of the second side plate P2. As shown, the second plate portion 12 of the first side plate P1 may be spaced apart from the second side plate P2 by a distance of D2; more specifically, the tray body 10 has a width of D2 between the second plate portion 12 of the first side plate P1 and the second plate portion 12 of the second side plate P2. The distance (or, width) D1 is greater than the distance (or, width) D2. In other words, the portion of the tray body 10 that is located at the first plate portions 11 is relatively wider than the portion of the tray body 10 that is located at the second plate portions 12. In this arrangement, when the tray body 10 is accommodated within the housing 90, the second plate portions 12 are able to be at the portions of the housing 90 that have the recess portions 911 so that the tray body 10 will not have physical interference with the sidewalls 91 of the housing 90.

Since the first plate portion 11 and the second plate portion 12 are not coplanar to each other, there may be a step portion ST connected between the first plate portion 11 and the second plate portion 12. The step portion ST may have a through hole H.

Optionally, to ensure that the tray body 10 can be installed into the housing 90 or removed from the housing 90 along predetermined directions, the first side plate P1 may include at least one guiding slot 13. For example, the first side plate P1 may include a plurality of guiding slots 13 arranged on the first plate portion 11 and/or the second plate portion 12. Correspondingly, the housing 90 may include at least one positioning post 94 (as shown in FIG. 3) protruding from an inner surface of the sidewall 91. The guiding slot 13 may be a slot substantially parallel to a placement direction PD of the tray body 10. The placement direction PD means the predetermined direction of installing the tray body 10 into the housing 90 or the direction of removing the tray body 10 out of the housing 90. The positioning post 94 is slidably disposed at the guiding slot 13 during the placement of the tray body 10 into the housing or the removal of the tray body 10 out of the housing 90 and thereby ensuring that the tray body 10 is moved along the placement direction PD.

Optionally, the first side plate P1 may include at least one installation slot 14. For example, the first side plate P1 may include a plurality of installation slots 14 arranged on the first plate portion 11 and/or the second plate portion 12. Correspondingly, the housing 90 may include at least one guide post 95 (as shown in FIG. 3) protruding from the inner surface of the sidewall 91. For example, the guide post 95 may be, but is not limited to, a T-shaped structure, such as a T type bolt. The installation slot 14 may be substantially parallel to the placement direction PD of the tray body 10. The guide post 95 is slidably disposed at the installation slot 14 during the placement of the tray body 10 into the housing or the removal of the tray body 10 out of the housing 90 and thereby ensuring that the tray body 10 is moved along the placement direction PD.

Figure 9:
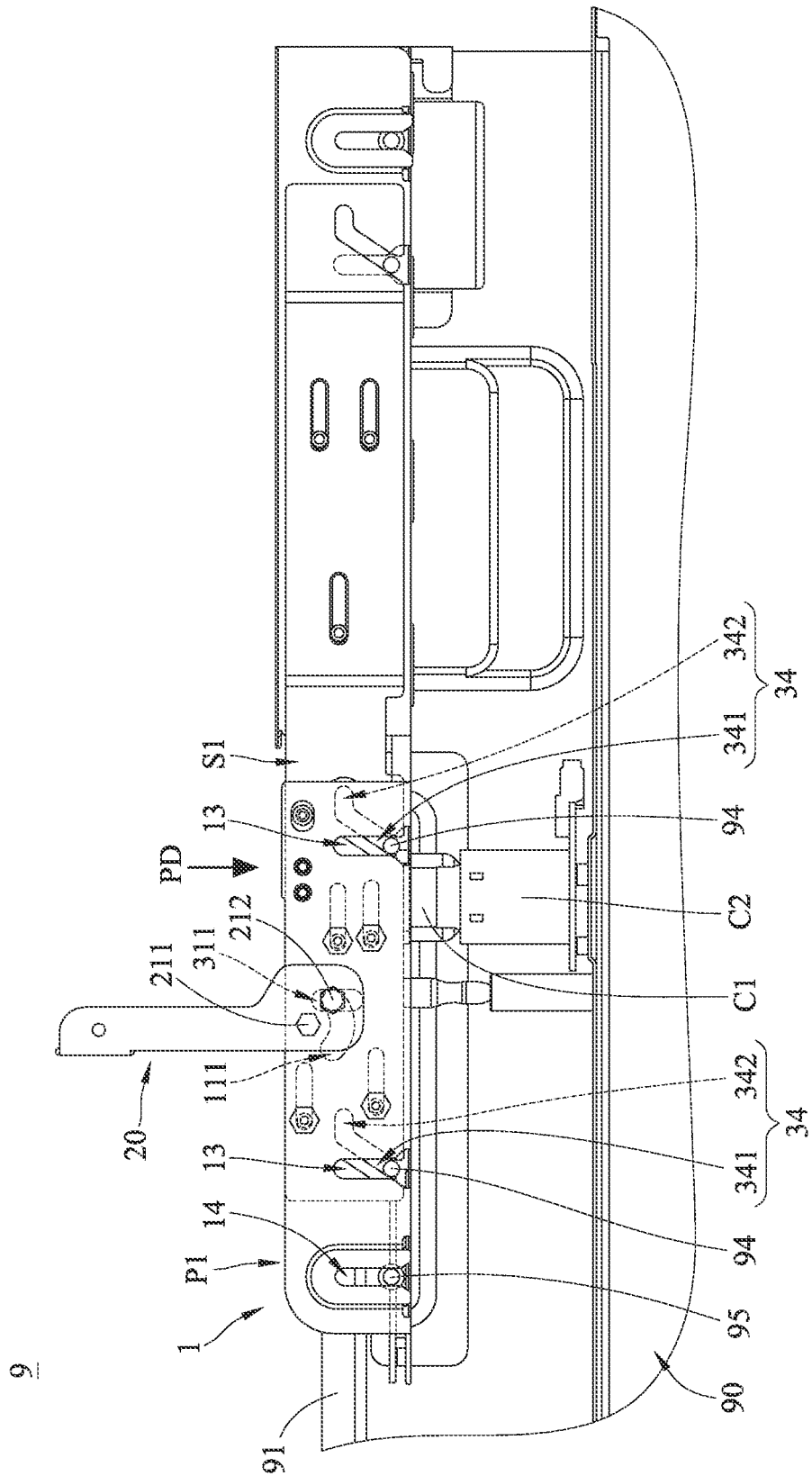
FIGS. 9-11 depict the operation of the tray assembly according to one embodiment of the disclosure.
Figure 11:
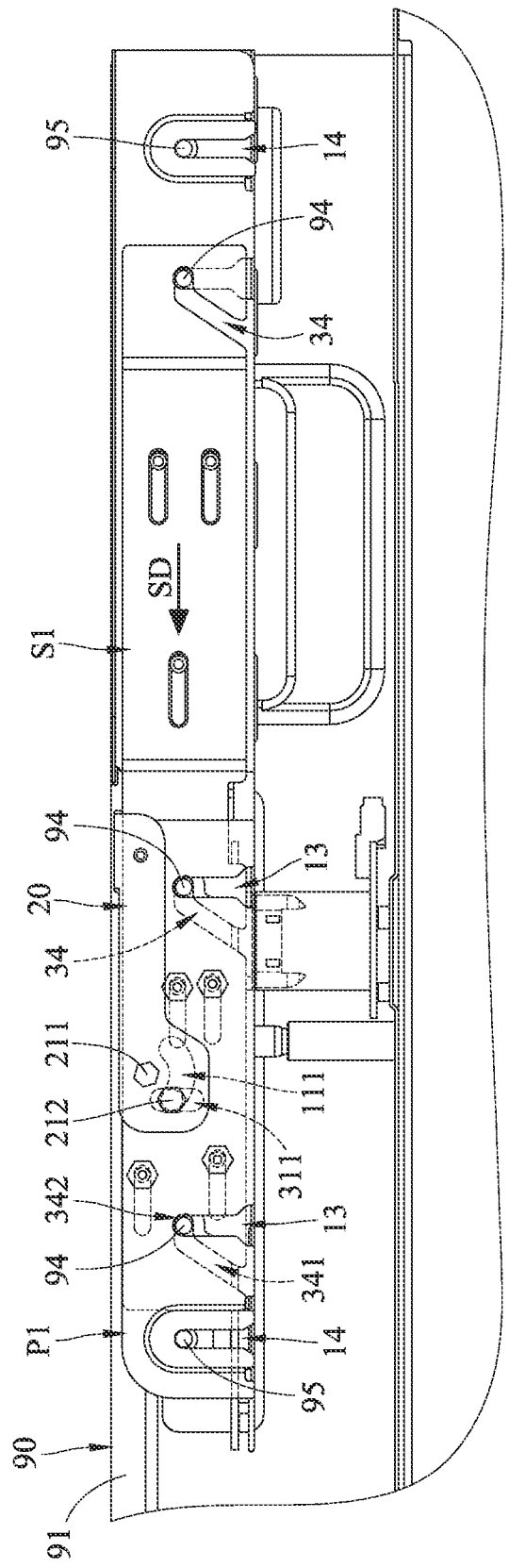

Please refer to FIGS. 4-5, in this embodiment, the tray handle 20 is pivotally connected to the first side plate P1 and the second side plate P2 of the tray body 10. In specific, the tray handle 20 may include two arm portion 21 and a handheld able portion 22, one end of each arm portion 21 is pivotally connected to the first plate portion 11 of the tray body 10, thus, the tray handle 20 is pivotable relative to the tray body 10 and is pivotable between a standing position (as shown in FIG. 4 or FIG. 9) and a lying position (as shown in FIG. 11); that is, the tray handle 20 is switchable between a standing position and a lying position relative to the tray body 10. The handheld able portion 22 is connected between the arm portions 21 and is connected to the first side plate P1 and the second side plate P2 via the arm portions 21. The handheld able portion 22 is configured to for user to hold and operate the tray handle 20.

The tray handle 20 may include at least one pin 211 and at least one push post 212, the pin 211 protrudes from the arm portion 21, and the arm portion 21 is pivotably disposed on the first plate portion 11 via the pin 211. The push post 212 protrudes from the arm portion 21, as shown, the pin 211 is located between the push post 212 and the handheld able portion 22. Correspondingly, the first plate portion 11 may further include a handle-guiding slot 111 being a curved slot whose center located at the pin 211. The push post 212 is slidably disposed at the handle-guiding slot 111 so as to limit the pivotable range of the tray handle 20 relative to the tray body 10.

Note that the configurations of the first slide plate S1 and the second slide plate S2 are symmetrical, thus, for the purpose of simplicity, only one of them will be introduced in detail hereinafter.

Figure 7:
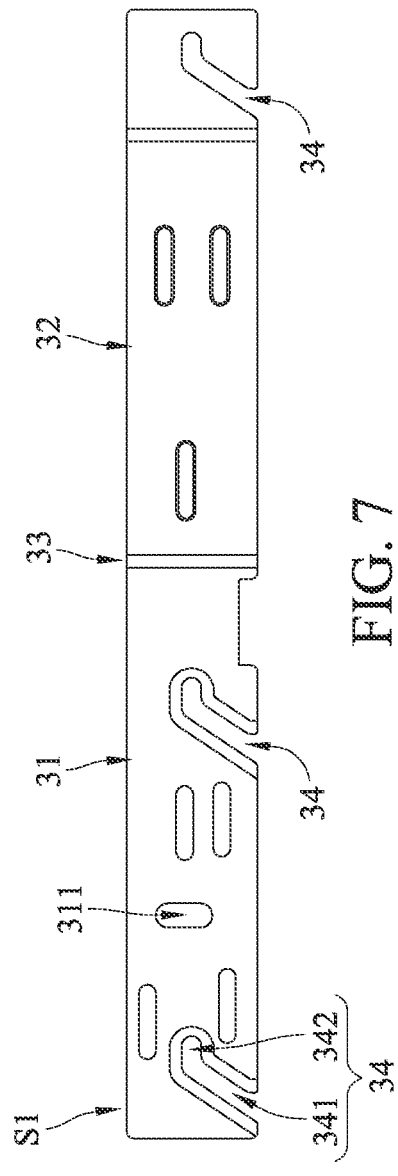
FIG. 7 is a side view of a first slide plate of the tray assembly according to one embodiment of the disclosure.
Figure 8:
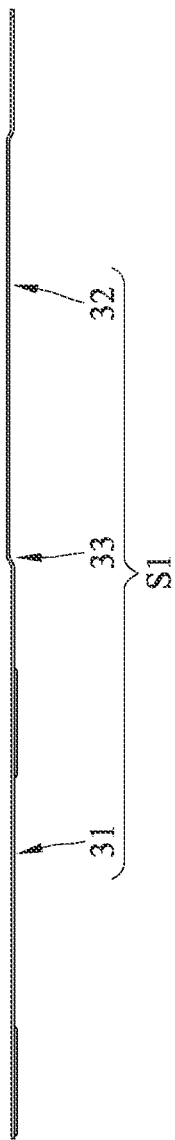
FIG. 8 is a top view of the first slide plate according to one embodiment of the disclosure.

Please refer to FIGS. 4-6 and further refer to FIGS. 7-8, where FIG. 7 is a side view of the first slide plate S1 of the tray assembly 1, and FIG. 8 is a top view of the first slide plate S1, in this embodiment, the first slide plate S1 is slidably disposed on the first side plate P1 along a slidable direction SD and is slidable between a releasing position (as shown in FIG. 4 or FIG. 9) and an engaging position (as shown in FIG. 11) relative to the first side plate P1; that is, the first slide plate S1 is switchable between a releasing position and an engaging position relative to the first side plate P1. The slidable direction SD is substantially perpendicular to the placement direction PD of the tray body 10; that is, the slidable direction SD is substantially perpendicular to the guiding slot 13 and the installation slot 14 on the first side plate P1.

Further, in this embodiment, the first slide plate S1 may be slidably passing through the through hole H of the first side plate P1 along the slidable direction SD, thus, the first slide plate S1 is partially located at the inner side of the first plate portion 11 while partially located at the outer side of the second plate portion 12. In specific, in this embodiment, the first slide plate S1 may include a first slide plate portion 31, a second slide plate portion 32, and a bent portion 33, the first slide plate portion 31 and the second slide plate portion 32 are substantially parallel to each other and the bent portion 33 is connected between the first slide plate portion 31 and the second slide plate portion 32 so that the first slide plate portion 31 and at least part of the second slide plate portion 32 are not coplanar. The first slide plate portion 31 is slidably passing through the through hole H on the first side plate P1 so that the first slide plate portion 31 is slidably located at an inner surface 110 of the first plate portion 11 of the first side plate P1 and the second slide plate portion 32 is slidably located at an outer surface 120 of the second plate portion 12 of the first side plate P1. In this arrangement, the tray assembly 1 has a width W3 between the second slide plate portions 32 of the first slide plate S1 and the second slide plate S2 (as shown in FIG. 3), and the width W3 is shorter than the width W2 of the part of the housing 90 that is located at the recess portions 911. Optionally, the second slide plate portion 32 may also have a bent portion (not numbered) similar to the bent portion 33 so that the shape of the second slide plate portion 32 can mate the contour of the adjacent structure.

The first slide plate S1 is movable by the tray handle 20. In specific, in this embodiment, the first slide plate S1 may include a groove 311 located at the first slide plate portion 31, and an extension direction of the groove 311 may be different from the slidable direction SD of the first slide plate S1. For example, the extension direction of the groove 311 may be substantially perpendicular to the slidable direction SD of the first slide plate S1. In other words, the extension direction of the groove 311 may be substantially parallel to the placement direction PD of the tray body 10. Part of the groove 311 may be exposed from the handle-guiding slot 111 of the first plate portion 11; in other words, part of the groove 311 may overlap the handle-guiding slot 111 of the first plate portion 11. The push post 212 of the tray handle 20 is slidably disposed at the handle-guiding slot 111 of the first plate portion 11 of the first side plate P1 and at least part of the push post 212 is slidably disposed within the groove 311 of the first slide plate S1. When the tray handle 20 is switching between the standing position and the lying position, the push post 212 is moved along the handle-guiding slot 111 and pushes an inner edge of the groove 311 of the first slide plate S1, thereby causing the first slide plate S1 to move along the slidable direction SD.

The first slide plate S1 is able to be releasably engaged with the positioning post 94 on the housing 90 by being forced by the tray handle 20. In specific, the first slide plate S1 may include at least one engagement slot 34. For example, in this embodiment, the first slide plate S1 may include a plurality of engagement slots 34 arranged on the first slide plate portion 31 and/or the second slide plate portion 32. At least part of the engagement slot 34 is exposed from the guiding slot 13 of the first side plate P1; in other words, at least part of the engagement slot 34 overlaps the guiding slot 13 of the first side plate P1. The positioning post 94 of the housing 90 is slidably disposed at the guiding slot 13 and the engagement slot 34. When the positioning post 94 is slidable along the guiding slot 13 and the tray handle 20 causes the first slide plate S1 to move along the slidable direction SD, the positioning post 94 is moved along the engagement slot 34 and may be engaged with the specific part of the engagement slot 34.

In specific, in this embodiment, the engagement slot 34 may include an inclined-guiding portion 341 and an transverse-guiding portion 342 connected to each other, the inclined-guiding portion 341 is connected between an edge of the first slide plate S1 and the transverse-guiding portion 342, an extension direction of the inclined-guiding portion 341 is inclined relative to the slidable direction SD of the first slide plate S1, and an extension direction of the transverse-guiding portion 342 is substantially parallel to the slidable direction SD of the first slide plate S1. When the first slide plate S1 is in the releasing position as shown in FIG. 4 or FIG. 9, part of the guiding slot 13 overlaps part of the inclined-guiding portion 341; when the first slide plate S1 is in the engaging position as shown in FIG. 11, part of the guiding slot 13 overlaps part of the transverse-guiding portion 342 so that the positioning post 94 is held at the transverse-guiding portion 342 and thereby fixing the tray assembly 1 to the sidewall 91 of the housing 90.

Figure 10:
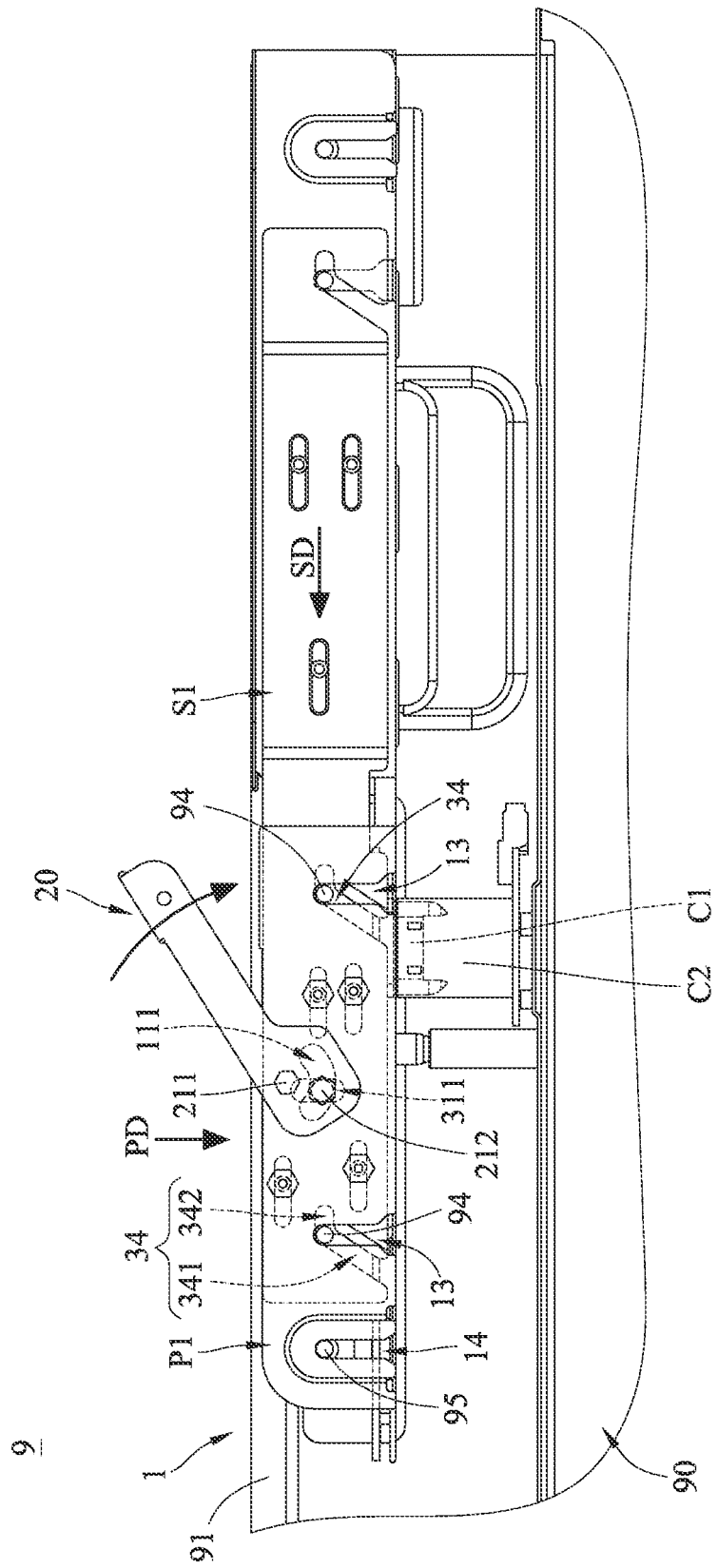

Please further refer to FIGS. 9-11 to introduce the operation of the tray assembly 1. Note that the following takes the side of the tray assembly 1 having the first side plate P1 and the first slide plate S1 as an example for introducing the operation of the tray assembly 1.

As shown in FIG. 9, when it is attempted to install the tray assembly 1 into the housing 90, the tray handle 20 may be firstly pivoted (rotated) to the standing position for the user to hold tray handle 20 and place the tray assembly 1 into the housing 90 along the placement direction PD. When the tray handle 20 is in the standing position, the push post 212 of the tray handle 20 is may be located at an end of the groove 311 of the first slide plate S1 and an end of the handle-guiding slot 111 of the first side plate P1, and the push post 212 is able to keep the inclined-guiding portion 341 of the engagement slot 34 partially overlapping the guiding slot 13 by abutting the inner edge of the groove 311. At this moment, the first slide plate S1 is fixed in the releasing position. When the tray assembly 1 is further placed into the housing along the placement direction PD, the positioning post 94 which protrudes from the sidewall 91 of the housing 90 enters into the guiding slot 13 of the tray body 10 and the inclined-guiding portion 341 of the engagement slot 34. Meanwhile, the guide post 95 which protrudes from the sidewall 91 of the housing 90 enters into the installation slot 14 of the tray body 10. Since the extension directions of the guiding slot 13 and the installation slot 14 are substantially parallel to the placement direction PD of the tray body 10, the tray body 10 is ensured to move along the placement direction PD to be installed into the housing 90, thereby ensuring that the connector C1 on the tray assembly 1 accurately connects the connector C2 on the housing 90.

Then, in FIG. 10, as the tray body 10 is moved further into the housing 90, the tray handle 20 can be pivoted (rotated) towards the lying position (as indicated by the arrow). During the movement of the tray handle 20, the push post 212 of the tray handle 20 pushes the inner edge of the groove 311 of the first slide plate S1 and slides along the handle-guiding slot 111 of the first side plate P1, thereby causing the first slide plate S1 to slide relative to the first side plate P1 of the tray body 10 along the slidable direction SD (i.e., causing the first slide plate S1 to move towards the engaging position). This causes the positioning post 94 to move to an end of the transverse-guiding portion 342 through the inclined-guiding portion 341 of the engagement slot 34 and therefore causes the connector C1 of the tray body 10 to electrically connect the connector C2. By doing so, the components (not shown, for example, a power distribution module and a power supply module) supported by the tray body 10 of the tray assembly 1 is allowed to electrically connect the relevant components on the housing 90 via the connection of the connector C1 and the connector C2.

Then, in FIG. 11, the tray handle 20 is pivoted (rotated) to the lying position, during this process, the push post 212 of the tray handle 20 causes the first slide plate S1 to move to the engaging position along the slidable direction SD by pushing the inner edge of the groove 311, and the positioning post 94 is located at another end of the transverse-guiding portion 342 located away from the inclined-guiding portion 341 and therefore fixes the positioning post 94 at the end of the guiding slot 13. By doing so, the positioning post 94 is not allowed to move along the guiding slot 13, and the cooperation of the transverse-guiding portion 342, the positioning post 94, and the guiding slot 13 limits the first slide plate S1 from moving along the placement direction PD, thereby preventing the tray assembly 1 from moving along the placement direction PD due to external force or impact. Meanwhile, the cooperation of the guide post 95 and the installation slot 14 limits the tray body 10 from moving in directions other than the placement direction PD. As such, the tray body 10 is restricted in all directions and thereby securing the electrical connection of the connectors C1 and C2.

Figure 12:
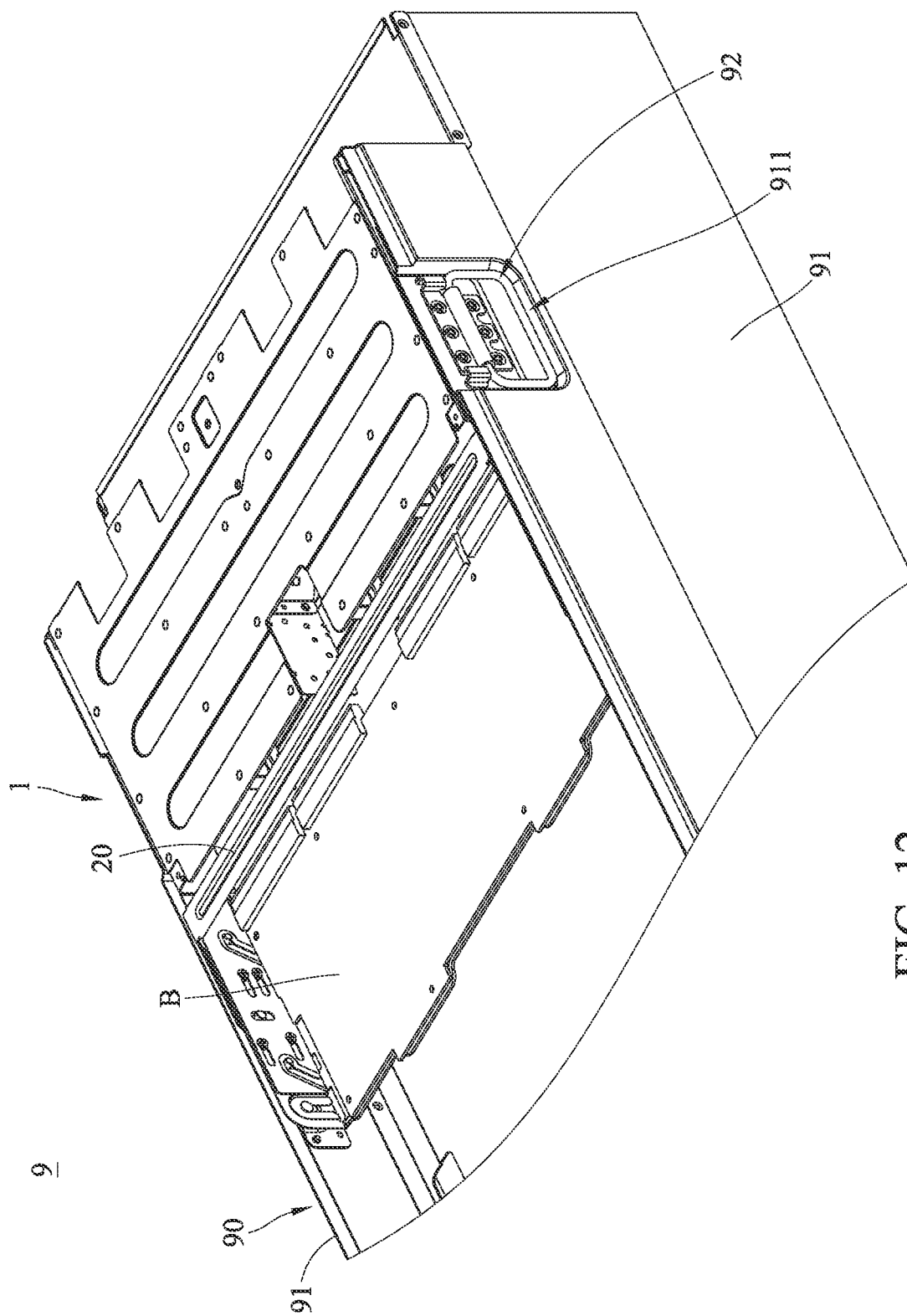
FIG. 12 is a partially enlarged perspective view of an electronic device according to one embodiment of the disclosure.

Please see FIG. 12, which is a partially enlarged perspective view of the electronic device 9. As shown, the tray assembly 1 is installed in the housing 90, and the tray assembly 1 is able to mate the housing 90 having an internal space with width variation (i.e., the housing 90 with at least one recess portion 911) while enabling a toolless and efficient installation and removal steps.

It is noted that the removal of the tray assembly 1 from the housing 90 can be easily achieved by reversely following the aforementioned steps. For example, the tray handle 20 may be pivoted (rotated) back to the standing position from the lying position, so that the push post 212 can push the groove 311 so as to move the first slide plate S1 and the second slide plate S2 back to the releasing position, during this process, the positioning post 94 is moved back to the inclined-guiding portion 341, and the tray assembly 1 can be lifted up while the tray handle 20 is pivoting, thus, the tray body 10 is moved away from the connector C2 (i.e., disconnecting the connector C1 form the connector C2) and can be taken out of the housing 90.

As discussed, the tray assembly 1 is applicable to a housing with width variation and the installation and removal of the tray assembly 1 can be simply achieved by operating the tray handle 20, thus the tray assembly 1 enables an effortless, easy, and toolless operation while capable of fitting different contours of internal space of a housing.

Optionally, please see FIG. 5 the tray assembly 1 may further include at least one elastic positioning piece 40 disposed on the first plate portion 11. When the tray handle 20 is in the lying position, the elastic positioning piece 40 may be engaged with the tray handle 20 so as to secure the tray handle 20 in the lying position. While the tray handle 20 is moved to the lying position, the elastic positioning piece 40 can generate clicking sound by elastically deformed by and engaging with the tray handle 20, improving the user experience.

Figure 13:
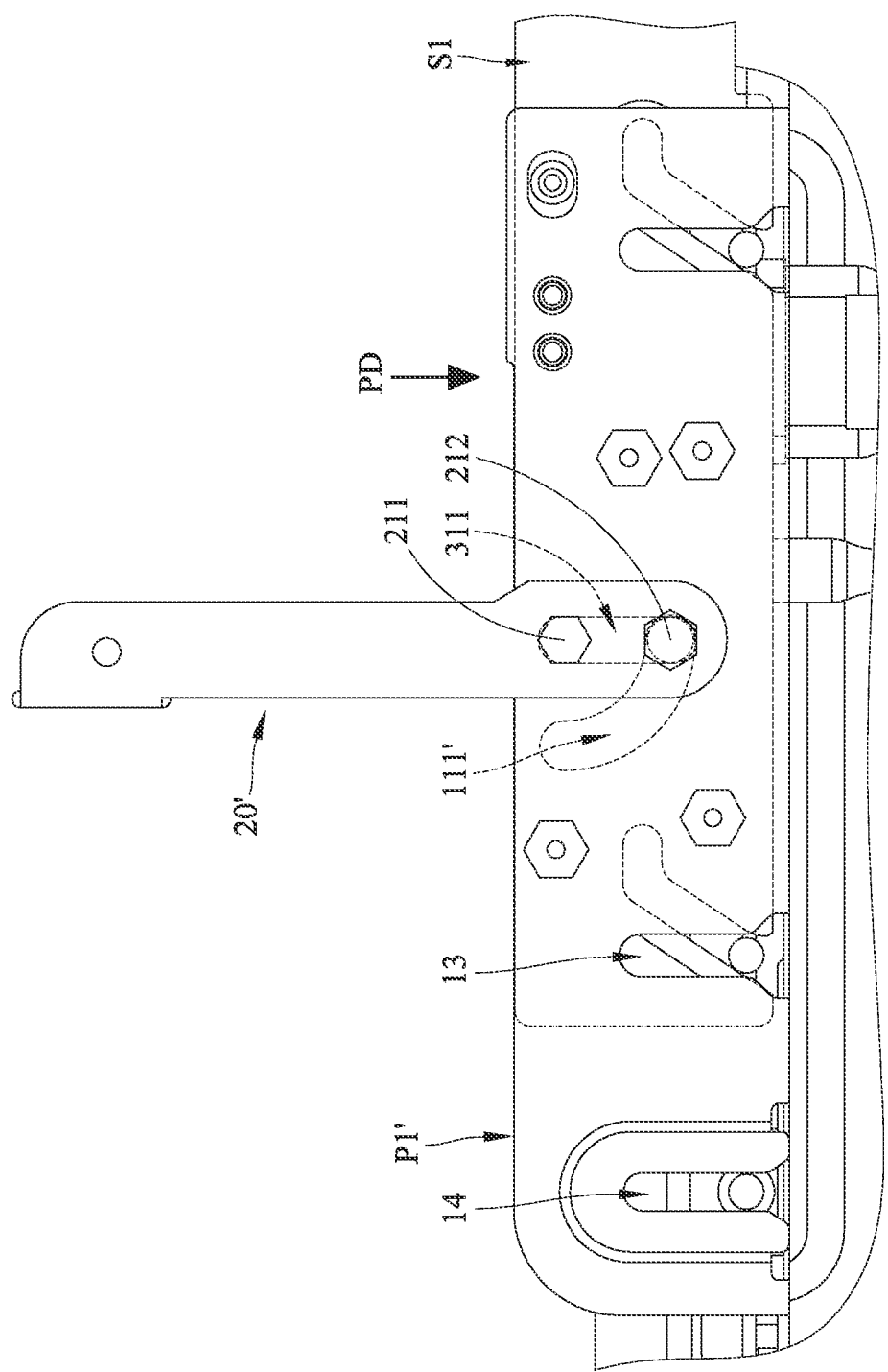
FIG. 13 is a partially enlarged side view of a tray assembly according to another embodiment of the disclosure.

Note that the positions of the handle-guiding slot of the first plate portion and the push post of the tray handle may be modified as required as long as they do not affect the tray handle from moving between the standing position and the lying position. For example, please see FIG. 13, which is a partially enlarged side view of a tray assembly having a first side plate P1' according to another embodiment of the disclosure, as shown, a guiding slot 111' of the first side plate P1' may be arranged at, for example, the left side of the pin 211 of the tray handle 20', thus, while the tray handle 20' is switching between the standing position and the lying position, the distance between the two opposite ends of the guiding slot 111' limits the horizontal movable range of the push post 212 and thereby changing the movable distance of the first slide plate S1 being pushed by the push post 212.

Figure 14:
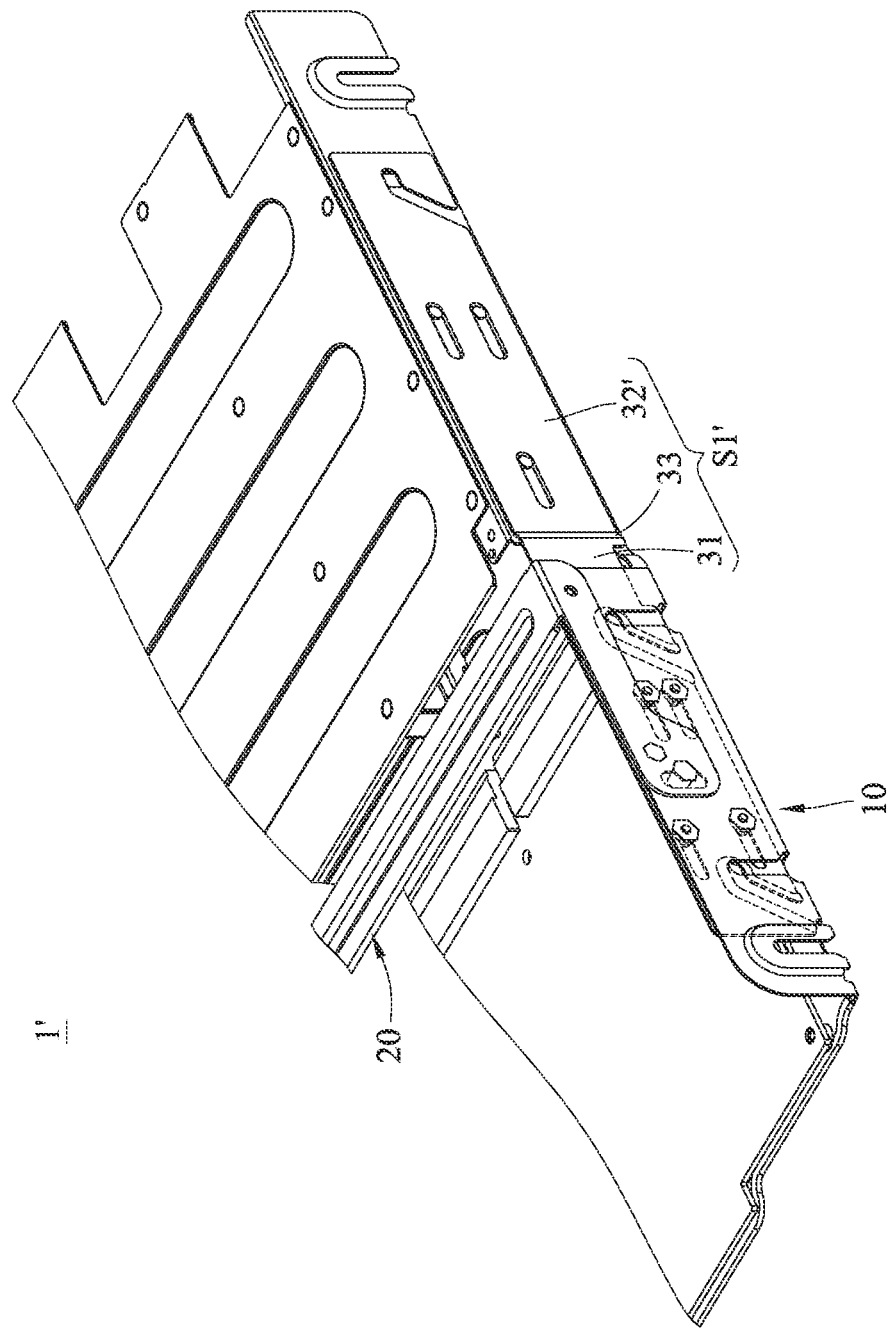
FIG. 14 is a partially enlarged perspective view the tray assembly according to another embodiment of the disclosure.

Please see FIG. 14, another embodiment of the disclosure provides a tray assembly 1', the main difference between the tray assembly 1' and the tray assemblies of the previous embodiments is the design of the slide plate. As shown, the second slide plate portion 32' of the first slide plate S1' may be a flat structure without any step or bent portion thereon.

Figure 15:
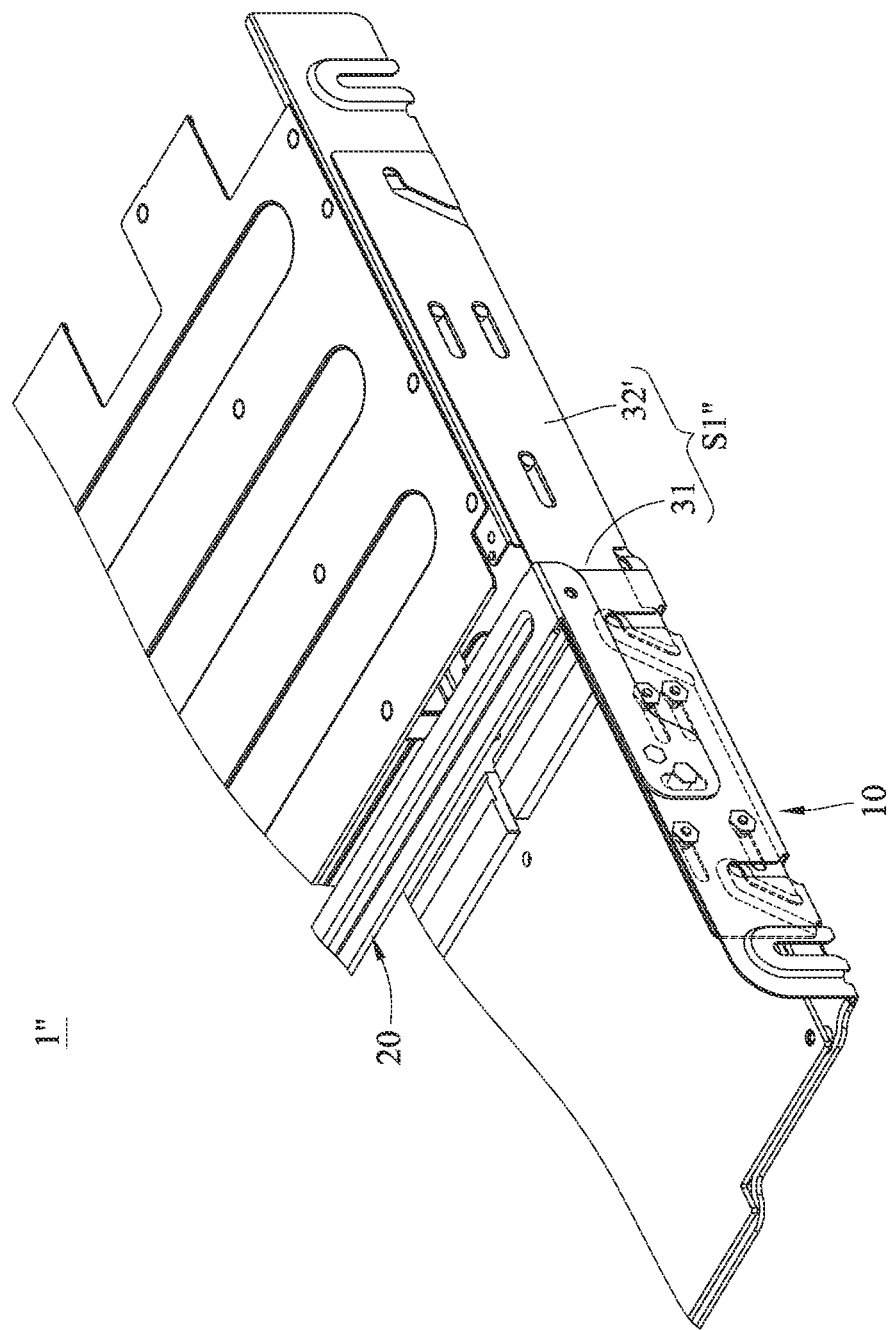
FIG. 15 is a partially enlarged perspective view of a tray assembly according to another embodiment of the disclosure.

Please see FIG. 15, another embodiment of the disclosure provides a tray assembly 1", the main difference between the tray assembly 1" and the tray assemblies of the previous embodiments is the design of the slide plate. As shown, the second slide plate portion 32' of the first slide plate S1" may be coplanar with the first slide plate portion 31; that is, the first slide plate S1" may be a flat structure without any step or bent portion thereon.

Figure 16:
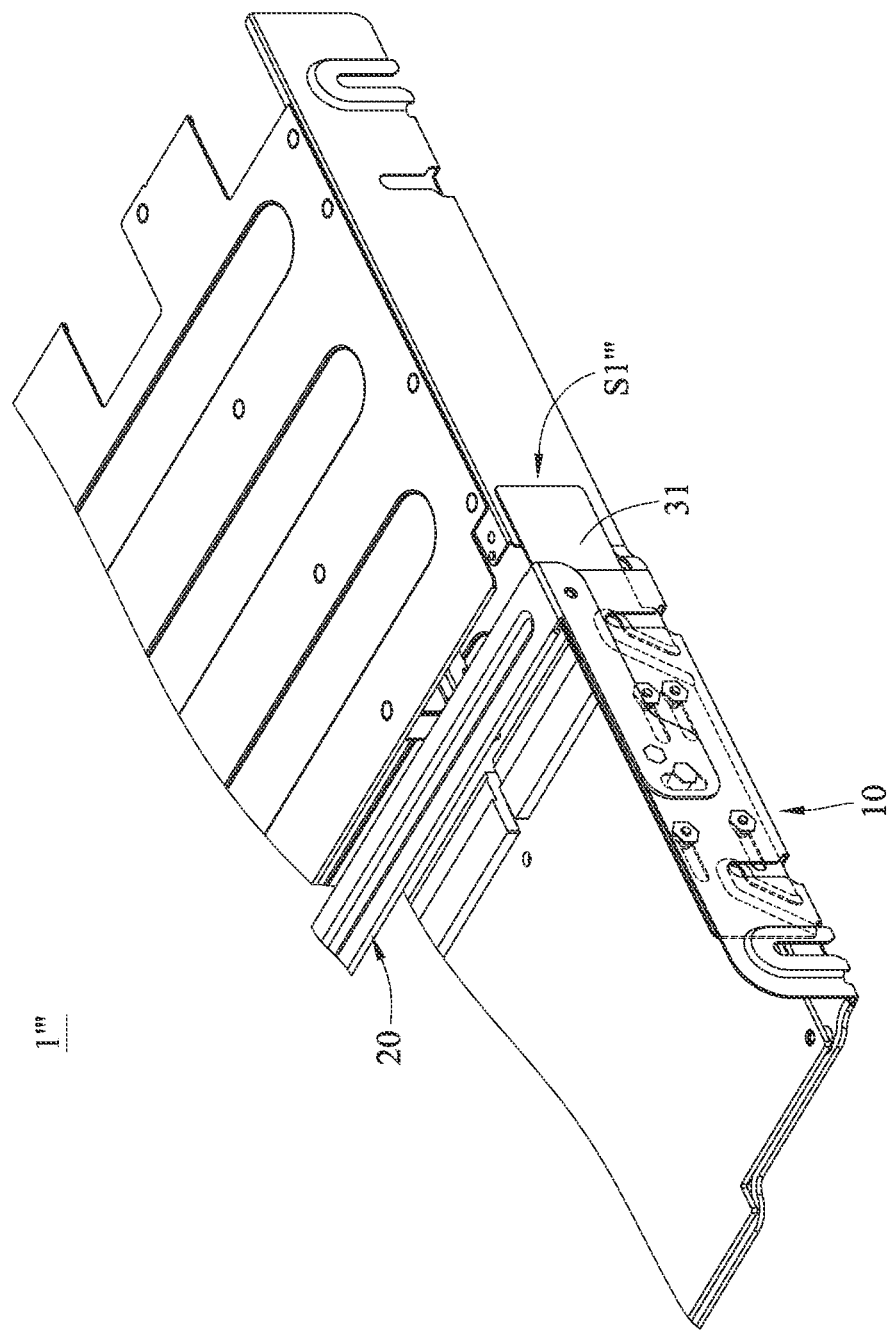
FIG. 16 is a partially enlarged perspective view of a tray assembly according to another embodiment of the disclosure.

Please see FIG. 16, another embodiment of the disclosure provides a tray assembly 1''', the main difference between the tray assembly 1''' and the tray assemblies of the previous embodiments is the design of the slide plate. As shown, the first slide plate S1''' may only include the first slide plate portion 31.

It is noted that the person having ordinary skill can further modify or adjust the tray assembly of the disclosure according to other actual requirements. For example, in other embodiments, the tray assembly may omit the second slide plate and the second side plate; in this case, the tray assembly may still have different widths at different portions of the first side plate. In another embodiment, the first side plate and the first slide plate may have two or more than two step and bent portions to mating the contour of the sidewall of the housing.

According to the tray assembly and the electronic device as discussed in the above embodiments of the disclosure, different portions of one side plate of the tray body are spaced apart from another side plate by different distances, or the slide plate that is movable with the tray handle is slidably disposed at the side plate, which makes the tray assembly of the disclosure capable of being accommodated within an internal space of a server housing with width variation and thereby facilitating to optimize the internal space utilization of the server housing.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A tray assembly, comprising:
   a tray body, comprising a first side plate and a second side plate, wherein the first side plate and the second side plate are located opposite to each other, the first side plate comprises a first plate portion and a second plate portion, a distance between the second plate portion and the second side plate is shorter than a distance between the first plate portion and the second side plate;
   a tray handle, pivotally connected to the first plate portion of the first side plate; and
   a first slide plate, slidably disposed on the first side plate and movable with the tray handle;
   wherein the first slide plate comprises a first slide plate portion and a second slide plate portion, the first slide plate portion is slidably located at an inner surface of the first plate portion of the first side plate, and the second slide plate portion is slidably located at an outer surface of the second plate portion of the first side plate.

2. The tray assembly according to claim 1, wherein the tray handle comprises a pin and a push post, the tray handle is connected to the first plate portion via the pin, the first slide plate comprises a groove, the push post is slidably disposed within the groove, and an extension direction of the groove is different from a slidable direction of the first slide plate.

3. The tray assembly according to claim 1, wherein the first slide plate further comprises a bent portion connected between the first slide plate portion and the second slide plate portion, and the first slide plate portion and the second slide plate portion are not coplanar.

4. The tray assembly according to claim 1, wherein the first slide plate portion and the second slide plate portion are coplanar with each other.

5. The tray assembly according to claim 1, wherein the first slide plate is slidable between a releasing position and an engaging position relative to the first side plate, the tray handle is pivotable between a standing position and a lying position relative to the first side plate, when the first slide plate is in the releasing position, the tray handle is in the standing position, and when the first slide plate is in the engaging position, the tray handle is in the lying position.

6. An electronic device, comprising:
a housing, comprising a sidewall and a positioning post, wherein the sidewall comprises a recess portion;
a housing handle, disposed at the recess portion; and
a tray assembly, detachably accommodated in the housing and comprising:
a tray body, comprising a first side plate and a second side plate located opposite to each other, wherein the first side plate comprises a first plate portion and a second plate portion, a distance between the second plate portion and the second side plate is shorter than a distance between the first plate portion and the second side plate, the second plate portion corresponds to the recess portion;
a tray handle, pivotally connected to the first side plate and the second side plate; and
a first slide plate, slidably disposed on the first side plate, wherein when the first slide plate is forced by the tray handle, the first slide plate is releasably engaged with the positioning post of the housing.

7. The electronic device according to claim 6, wherein the tray handle comprises a pin and a push post, the tray handle is connected to the first plate portion via the pin, the first slide plate comprises a groove, the push post is slidably disposed within the groove, and an extension direction of the groove is different from a slidable direction of the first slide plate.

8. The electronic device according to claim 7, wherein the first plate portion comprises a guiding slot, the first slide plate comprises an engagement slot, the positioning post of the housing is slidably disposed within the guiding slot and the engagement slot, an extension direction of the guiding slot is perpendicular to a slidable direction of the first slide plate, the engagement slot comprises an inclined-guiding portion and a transverse-guiding portion, the inclined-guiding portion and the transverse-guiding portion are connected to each other, an extension direction of the transverse-guiding portion is parallel to the slidable direction of the first slide plate, an extension direction of the inclined-guiding portion is inclined relative to the slidable direction of the first slide plate, the first slide plate is slidable between a releasing position and an engaging position relative to the first side plate, when the first slide plate is in the releasing position, the guiding slot overlaps the inclined-guiding portion, and when the first slide plate is in the engaging position, the guiding slot overlaps the transverse-guiding portion.

9. The electronic device according to claim 6, wherein the first plate portion further comprises an installation slot, the housing further comprises a guide post, an extension direction of the installation slot is perpendicular to a slidable direction of the first slide plate, and the installation slot is releasably engaged with the guide post.

10. The electronic device according to claim 8, wherein the tray handle is pivotable between a lying position and a standing position relative to the first plate portion, when the tray handle is in the standing position, the push post of the tray handle abuts an inner edge of the groove and the inclined-guiding portion of the engagement slot partially overlaps the guiding slot, and when the tray handle is in the lying position, the push post of the tray handle abuts the inner edge of the groove and the transverse-guiding portion of the engagement slot partially overlaps the guiding slot.

11. The electronic device according to claim 10, wherein the tray assembly further comprises an elastic positioning piece disposed on the first side plate, and when the tray handle is in the lying position, the elastic positioning piece is engaged with the tray handle.

12. The electronic device according to claim 6, wherein the first slide plate comprises a first slide plate portion and a second slide plate portion, the first slide plate portion is slidably located at an inner surface of the first plate portion of the first side plate, and the second slide plate portion is slidably located at an outer surface of the second plate portion of the first side plate.

13. The electronic device according to claim 12, wherein the first slide plate further comprises a bent portion connected between the first slide plate portion and the second slide plate portion, and the first slide plate portion and the second slide plate portion are not coplanar.

14. The electronic device according to claim 12, wherein the first slide plate portion and the second slide plate portion are located at a same plane.

15. A tray assembly, adapted to a housing, comprising:
a tray body, comprising a side plate;
a tray handle, pivotally connected to the side plate; and
a slide plate, slidably passing through the side plate, wherein the slide plate is movable with the tray handle;
wherein the side plate comprises a first plate portion, a step portion, and a second plate portion, the first plate portion is connected to the second plate portion via the step portion, the step portion comprises a through hole, and the slide plate is slidably passing through the through hole.

16. The tray assembly according to claim 15, wherein the slide plate comprises a first slide plate portion and a second slide plate portion, the first slide plate portion is slidably located at an inner surface of the first plate portion, the second slide plate portion is slidably located at an outer surface of the second plate portion.

17. The tray assembly according to claim 15, wherein the first plate portion comprises a guiding slot, the slide plate comprises an engagement slot, the housing comprises a positioning post, the positioning post is slidably disposed within the guiding slot and the engagement slot, an extension direction of the guiding slot is perpendicular to a slidable direction of the slide plate, the engagement slot comprises an inclined-guiding portion and an transverse-guiding portion connected to each other, an extension direction of the transverse-guiding portion is parallel to the slidable direction of the slide plate, an extension direction of the inclined-guiding portion is inclined relative to the slidable direction of the first slide plate, the first slide plate is slidable between a releasing position and an engaging position relative to the first-side plate, when the first slide plate is in the releasing position, the guiding slot overlaps the inclined-guiding portion, and when the first slide plate is in the engaging position, the guiding slot overlaps the transverse-guiding portion.

18. The tray assembly according to claim 17, wherein the first plate portion further comprises an installation slot, an extension direction of the installation slot is perpendicular to the slidable direction of the slide plate, the housing comprises a guide post, and the installation slot is releasably engaged with the guide post of the housing.

19. The tray assembly according to claim 17, wherein the tray handle is pivotable between a lying position and a standing position relative to the first plate portion, the tray handle comprises a push post, the slide plate comprises a groove, when the tray handle is in the standing position, the push post of the tray handle abuts an inner edge of the groove of the slide plate and the inclined-guiding portion of the engagement slot partially overlap the guiding slot, and when the tray handle is in the lying position, the push post of the tray handle abuts the inner edge of the groove and the transverse-guiding portion of the engagement slot partially overlaps the guiding slot.

20. The tray assembly according to claim 19, further comprising an elastic positioning piece disposed on the side plate, wherein the elastic positioning piece is engaged with the tray handle when the tray handle is in the lying position.

* * * * *